United States Patent
Sullivan et al.

(10) Patent No.: US 7,820,541 B2
(45) Date of Patent: Oct. 26, 2010

(54) PROCESS FOR FORMING LOW DEFECT DENSITY HETEROJUNCTIONS

(75) Inventors: Gerard J. Sullivan, Newbury Park, CA (US); Amal Ikhlassi, Thousand Oaks, CA (US); Joshua I. Bergman, Thousand Oaks, CA (US); Berinder Brar, Newbury Park, CA (US); Gabor Nagy, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 69 days.

(21) Appl. No.: 11/521,330

(22) Filed: Sep. 14, 2006

(65) Prior Publication Data

US 2008/0070399 A1   Mar. 20, 2008

(51) Int. Cl.
 *H01L 21/3205* (2006.01)
(52) U.S. Cl. .................................. 438/604; 438/606
(58) Field of Classification Search .................. 438/602
 See application file for complete search history.

(56) References Cited

U.S. PATENT DOCUMENTS

| | | | |
|---|---|---|---|
| 5,412,224 A | 5/1995 | Goronkin et al. | |
| 5,430,310 A | 7/1995 | Shibasaki et al. | |
| 5,739,559 A | 4/1998 | Kagaya et al. | |
| 6,215,136 B1 | 4/2001 | Tserng et al. | |
| 2002/0131462 A1* | 9/2002 | Lin et al. | 372/43 |
| 2003/0015767 A1* | 1/2003 | Emrick et al. | 257/528 |
| 2006/0035467 A1 | 2/2006 | Nam et al. | |
| 2006/0215718 A1 | 9/2006 | Yasuda et al. | |
| 2006/0246700 A1* | 11/2006 | Johnson | 438/606 |

* cited by examiner

*Primary Examiner*—Thanh V Pham
*Assistant Examiner*—Tony Tran
(74) *Attorney, Agent, or Firm*—Snell & Wilmer L.L.P.

(57) ABSTRACT

A method for forming a low defect density heterojunction between a first and a second compound, the first and second compounds each includes a group III element combined with a group V element in the periodic table, the method includes the steps of introducing in the deposition chamber the flux of the group III element for the first compound at substantially the same time while introducing in the deposition chamber a flux of the group V element for the second compound, stopping the flux of the group III element for the first compound after a first predetermined time period, stopping the flux of the group V element for the first compound after a second predetermined time period, and introducing in the deposition chamber a flux of the group III element the group V element for the second compound.

18 Claims, 9 Drawing Sheets

PROCESS FOR FORMING LOW DEFECT DENSITY HETEROJUNCTIONS

Statement Regarding Government Rights

This invention was made with Government support under contract N66001-01-C-8032 awarded by the Department of Defense, DARPA, US Navy, Space & Naval Warfare Systems (SPAWAR). The Government has certain rights in the invention.

BACKGROUND OF THE INVENTION

1. Field of the Invention.

The invention relates generally to a semiconductor fabrication method. More particularly, the invention relates to a process for forming low defect density heterojunctions in semiconductor devices.

2. Description of Related Art.

In advanced semiconductor devices, junctions between two different semiconductor materials are typically used to improve the performance of the device. These junctions, composed of layers of dissimilar semiconductor material, are known in the art as heterojunctions. The semiconductor materials used at the heterojunctions generally have non-equal band gaps and electron affinities.

A heterojunction has two pieces of semiconductor materials directly in contact with one another. It is often desirable to induce a specific type of bonding at the heterojunction. For example, forcing the heterojunction to have indium antimonide (InSb)-like bonding at an aluminum antimonide (AlSb) to indium arsenide (InAs) heterojunction for improved electron mobility, as described in G. Tuttle, H. Kroemer and J. English, "Effects of Interface layer sequencing on transport properties of InAs/AlSb quantum wells", J.A.P.- Vol. 67, No. 6, 15 Mar. 1990, pp. 3033. Another example is forcing the heterojunction to have InSb-like bonding in a gallium antimonide (GaSb) to indium arsenide (InAs) superlattice grown on a GaSb substrate for lattice strain compensation.

A common method for achieving this desired bonding is using Molecular Beam Epitaxy (MBE) for growth. One advantage of using MBE growth is low temperature processing, which minimizes out-diffusion and autodoping in the semiconductor material. Another advantage is the precise control of doping profiles and deposition thickness that MBE allows. The MBE process can be used to control the bonding of group III-V materials. For example, the MBE process can be used to produce a GaSb to InAs heterojunction with InSb bonding, as opposed to GaAs bonding, at the heterojunction.

The prior art process of forming a AlGaSb to InAs heterojunction includes the following steps. First, AlGaSb is deposited on a base substrate. During the growth of AlGaSb, the aluminum (Al) and gallium (Ga) fluxes are stopped, and the surface is soaked with the antimony (Sb) flux. This covers any exposed aluminum or gallium atoms with an antimony atom, and any excess antimony should re-evaporate under typical MBE growth temperatures and fluxes. Next, the antimony flux is stopped, and a monolayer of indium is deposited. This indium monolayer is bonded to the antimony atoms on the surface of the substrate. After the deposition of the monolayer of indium, the indium flux is continued and a suitable arsenic flux is initiated, resulting in the growth of InAs. This method of forming the heterojunction is called "forcing InSb-like bonding".

This procedure of interrupting growth, depositing a monolayer of the desired group III material, and then continuing growth has been discussed in the prior art. Unfortunately, this procedure causes defects at certain heterojunctions. For example, forcing InSb-like bonding at an InAs to AlGaSb heterojunction has resulted in tiny oval defects 113 nucleated at the heterojunction, as shown in FIG. 1. Meanwhile, forcing InSb-like bonding at an AlSb to InAs heterojunction does not result in nucleated defects. The tiny oval defects 113, shown in FIG. 1, formed at the InAs to AlSb heterojunction, have been correlated with excess leakage currents between metal gates (e.g. Schottky gates) and channels. If the metal gate crosses one of these defects, excess leakage from the gate to the channel of the transistor occurs. Hence, with an increasing demand for improved semiconductor fabrication methods, there remains a continuing need for a process for forming semiconductor materials with a low defect density.

BRIEF DESCRIPTION OF THE DRAWINGS

The exact nature of this invention, as well as the objects and advantages thereof, will become apparent from consideration of the following specification in conjunction with the accompanying drawings in which like reference numerals designate like parts throughout the figures.

SUMMARY OF THE INVENTION

A method for forming a low defect density heterojunction between a first semiconductor compound (i.e. InAs) and a second semiconductor compound (i.e. AlGaSb). The method controls the sequential deposition of the materials to control the detailed bonding at the heterojunctions, and minimize the nucleation of morphological defects. The method comprises depositing the first semiconductor compound on a substrate by introducing in a deposition chamber a flux of the group III element and the group V element for the first semiconductor compound, covering the deposited first semiconductor compound with a layer of the group V element for the first semiconductor compound to prevent the group III element for the first semiconductor compound from being exposed, and depositing the second semiconductor compound on the layer of the group V element for the first semiconductor compound by introducing in the deposition chamber a flux of the group III element and the group V element for the second semiconductor compound. This may produce an unforced heterojunction between the first and second semiconductor compounds.

In one embodiment, the group III and V elements of the first semiconductor compound is indium (In) and arsenic (As), respectively, while the group III and V elements of the second semiconductor compound is aluminum (Al), gallium (Ga) and antimony (Sb), respectively. In another embodiment, the group III and V elements of the first semiconductor compound is gallium (Ga) and antimony (Sb), respectively, while the group III and V elements of the second semiconductor compound is indium (In) and arsenic (As), respectively.

DETAILED DESCRIPTION OF THE PREFERRED EMBODIMENTS

Methods and systems that implement the embodiments of the various features of the invention will now be described with reference to the drawings. The drawings and the associated descriptions are provided to illustrate embodiments of the invention and not to limit the scope of the invention. Reference in the specification to "one embodiment" or "an embodiment" is intended to indicate that a particular feature, structure, or characteristic described in connection with the embodiment is included in at least an embodiment of the invention. The appearances of the phrase "in one embodiment" or "an embodiment" in various places in the specification are not necessarily all referring to the same embodiment. Throughout the drawings, reference numbers are re-used to indicate correspondence between referenced elements. In addition, the first digit of each reference number indicates the figure in which the element first appears.

Figure 1:
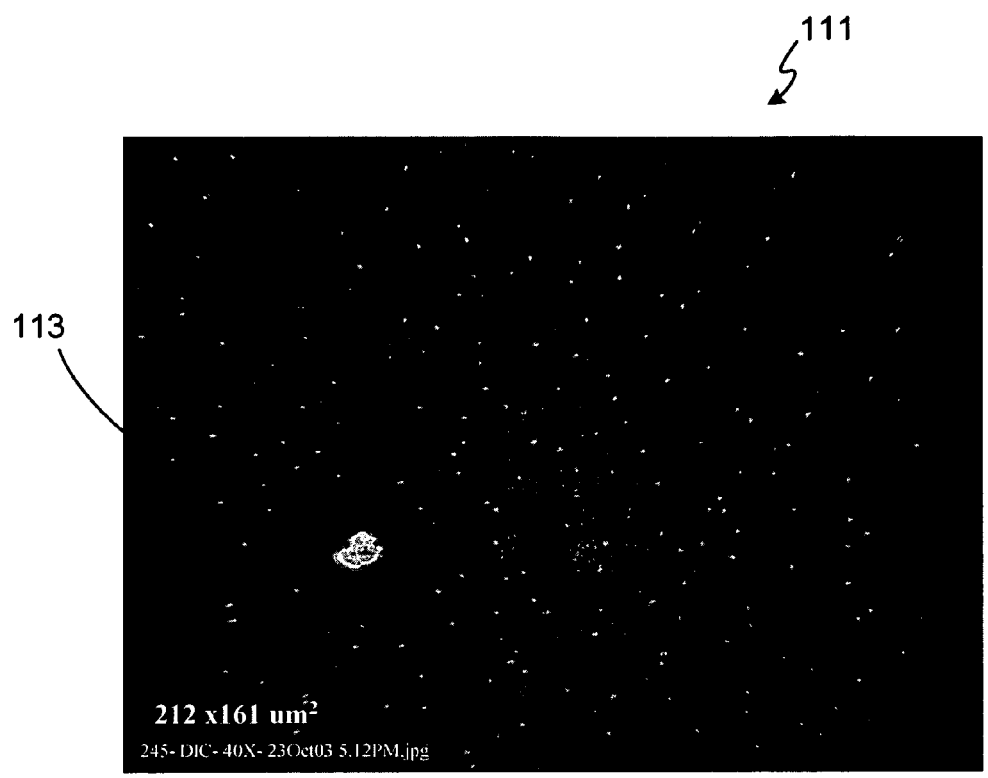
FIG. 1 is a differential interference contrast optical micrograph of the surface of a HFET layer structure, illustrating the effect of an InAs to AlSb heterojunction forced to have InSb-like bonding, resulting in a high defect density, grown according to a prior art semiconductor growth method.

FIG. 1 is a differential interference contrast optical micrograph of the surface of an HFET layer structure, illustrating a layer with a high defect density, according to a prior art semiconductor fabrication method. The optical micrograph 111 shows nucleated defects 113 on the surface. The defects 113 are randomly distributed across the surface. These defects 113 contribute to excess leakage currents from a transistor's gate (not shown). Although the prior method of forcing InSb-like bonding at the InAs to AlGaSb heterojunction results in nucleated defects 113, the new method of forcing InSb-like bonding at the InAs to AlGaSb heterojunction does not result in defects.

Figure 2:
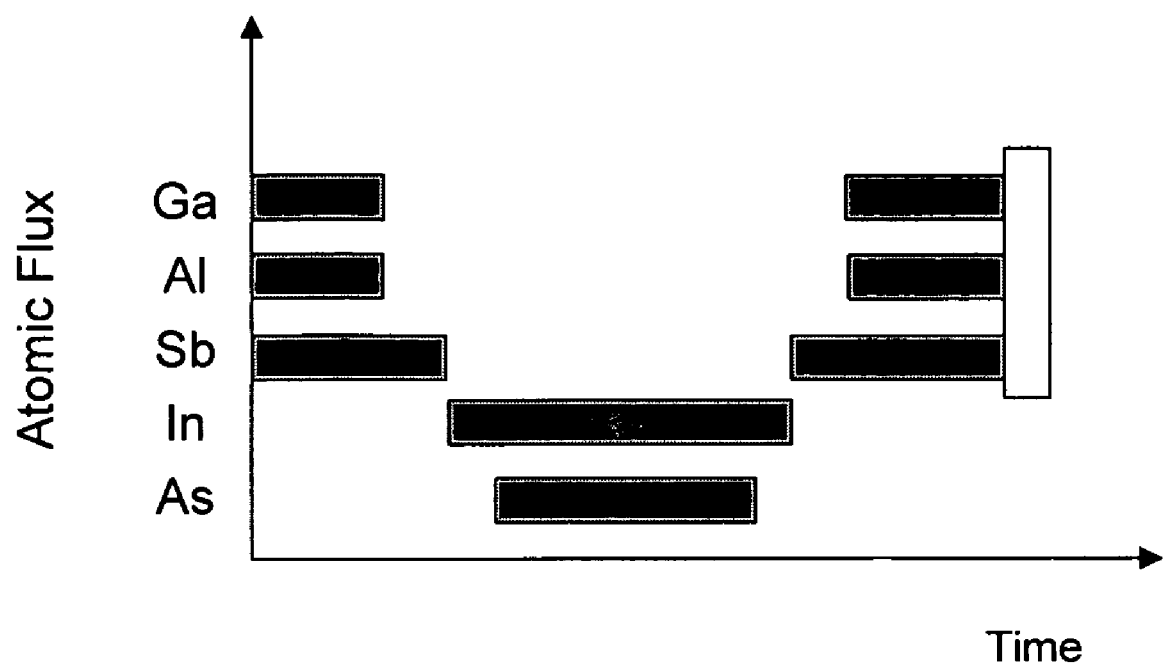
FIG. 2 is an exemplary diagram depicting the time sequence of events for controlling elemental flux in a deposition chamber, according to a prior art semiconductor fabrication method.

FIG. 2 is an exemplary diagram depicting the time sequence of events for controlling elemental fluxes to produce InSb-like bonding at a heterojunction, according to the prior art semiconductor fabrication method. Since the procedure of interrupting growth of AlGaSb, depositing an indium monolayer, and then continuing growth of InAs produces no defects 113, this procedure suffices in the formation of an AlGaSb to InAs heterojunction. However, heterojunctions that do experience nucleated defects 113 require a different growth procedure, as described herein.

Figure 3:
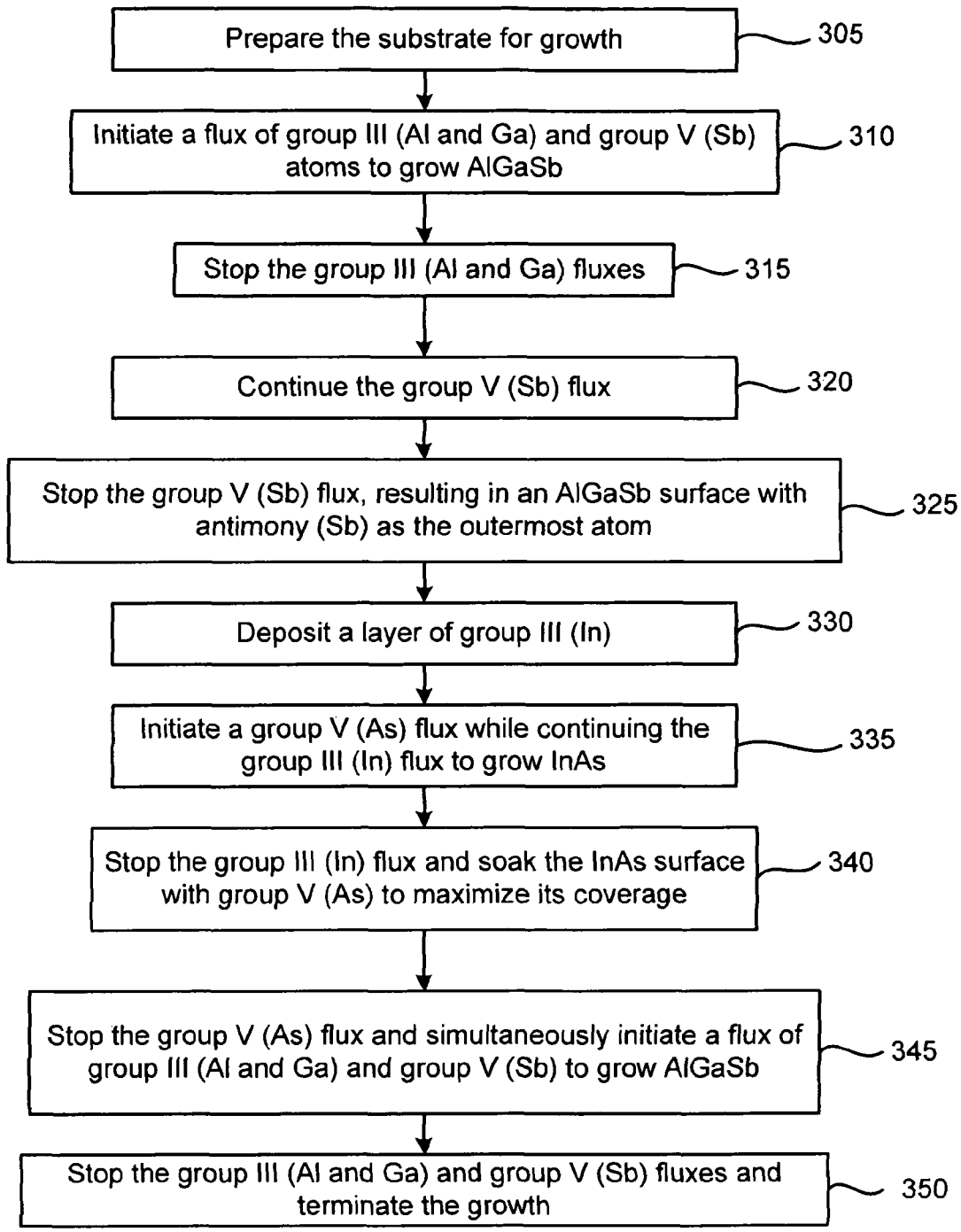
FIG. 3 is an exemplary flow chart depicting a method for forming low defect density heterojunctions, according to an embodiment of the invention.

FIG. 3 is an exemplary flow chart depicting a method for forming low defect density heterojunctions according to an embodiment of the invention. The steps for carrying out this method are schematically illustrated in FIGS. 4-11. Since the forced InAs to AlSb heterojunction was identified to be the source of the defects, the method embodying the invention will be discussed in the context of fabricating a low defect InAs to AlSb heterojunction. Nevertheless, this method can also be used for other heterojunctions between different semiconductor compounds, such as InAs to GaSb heterojunctions, including those that do not experience substantial defect density so as to alleviate the need for determining which forced heterojunctions do or do not have defects.

Figure 4:
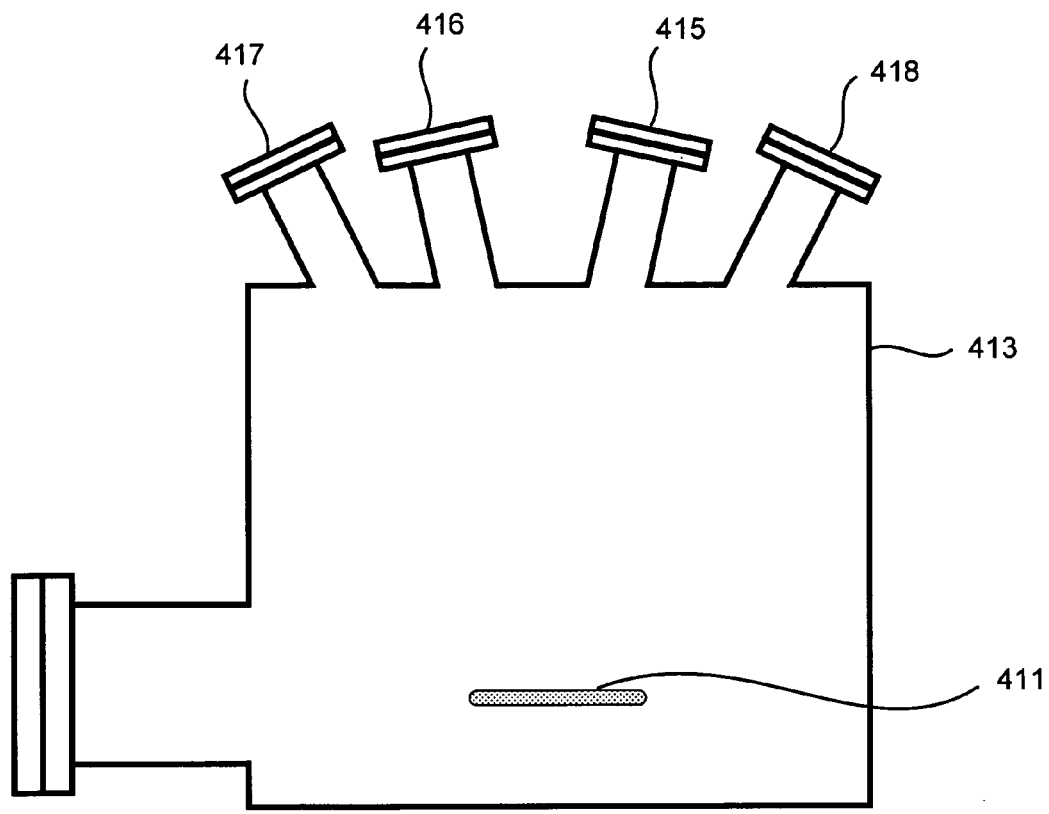
FIG. 4 is a cross-sectional view of an MBE system.

In Step 305, a substrate 411 is prepared for growth by placing it in an MBE deposition chamber 413. The base substrate 411 can be a silicon or gallium arsenide (GaAs) wafer. A cross-sectional view of the apparatus with the base substrate 411 is illustrated in FIG. 4.

Figure 5:
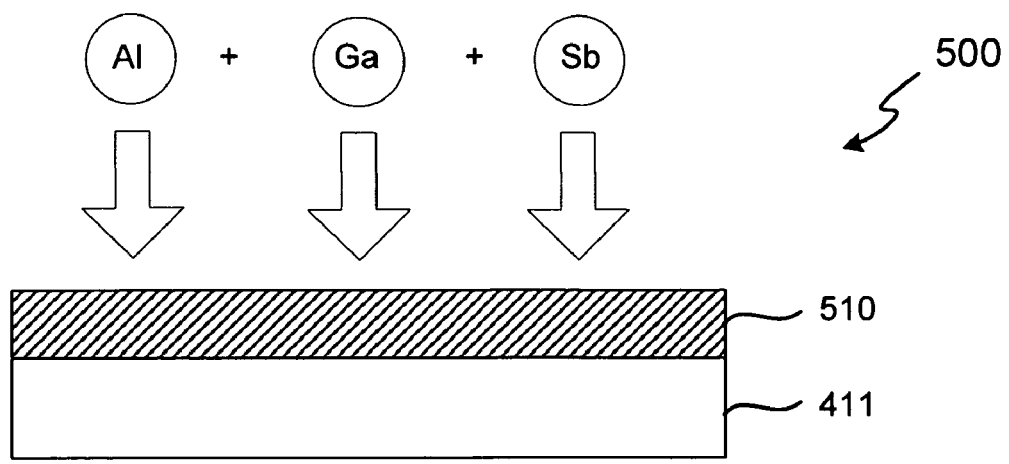
FIG. 5 schematically shows in cross-section a semiconductor compound AlGaSb deposited on the surface of a substrate according to an embodiment of the invention.

Next, in step 310, a constant flux of group III and V elements are introduced into the chamber at inlets 415, 416 and 417, respectively. In this example, the group III elements are aluminum (Al) and gallium (Ga), and the group V element is antimony (Sb). These elements react with one another to form an aluminum gallium antimonide (AlGaSb) layer 510. FIG. 5 shows AlGaSb layer 510 deposited on the surface of the substrate 411, collectively referred to as multilayer 500.

Figure 6:
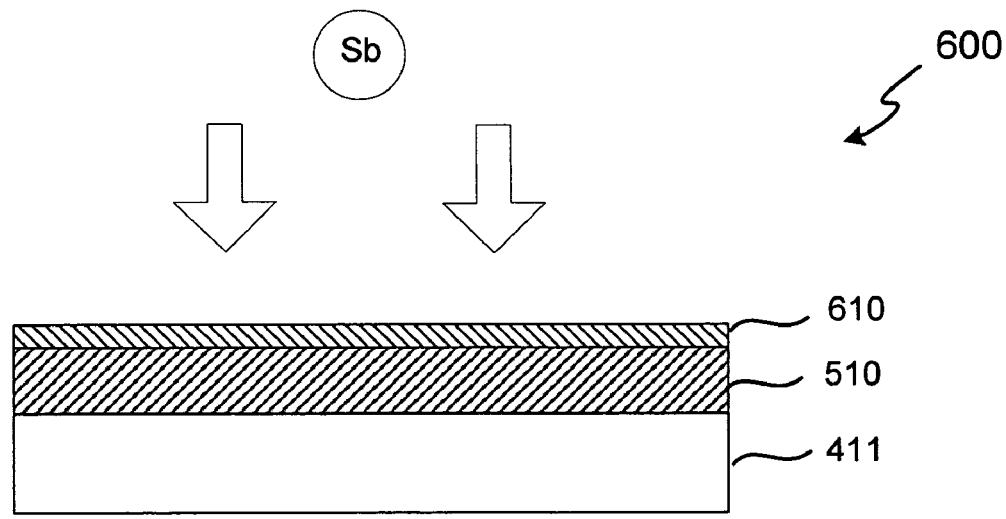
FIG. 6 schematically shows in cross-section a layer of group V element, antimony, being deposited on the surface of the AlGaSb according to an embodiment of the invention.

After a predetermined period, which is a function of the desired thickness of the AlGaSb, the fluxes of the group III elements, aluminum (Al) and gallium (Ga), are stopped in Step 315. Since there are no longer aluminum (Al) or gallium (Ga) fluxes in the deposition chamber 413, only the group V flux of antimony (Sb) is impinging on the surface of the AlGaSb, step 320. This covers any exposed aluminum (Al) or gallium (Ga) with antimony (Sb) layer 610, as shown in FIG. 6. Any excess antimony (Sb) should re-evaporate under typical MBE growth temperatures and fluxes. Once the antimony (Sb) layer is formed, the flux of the group V element, antimony (Sb), is stopped, step 325. The substrate 411, compound A (AlGaSb) and the antimony layer 610 are collectively referred to as multilayer 600.

Figure 7:
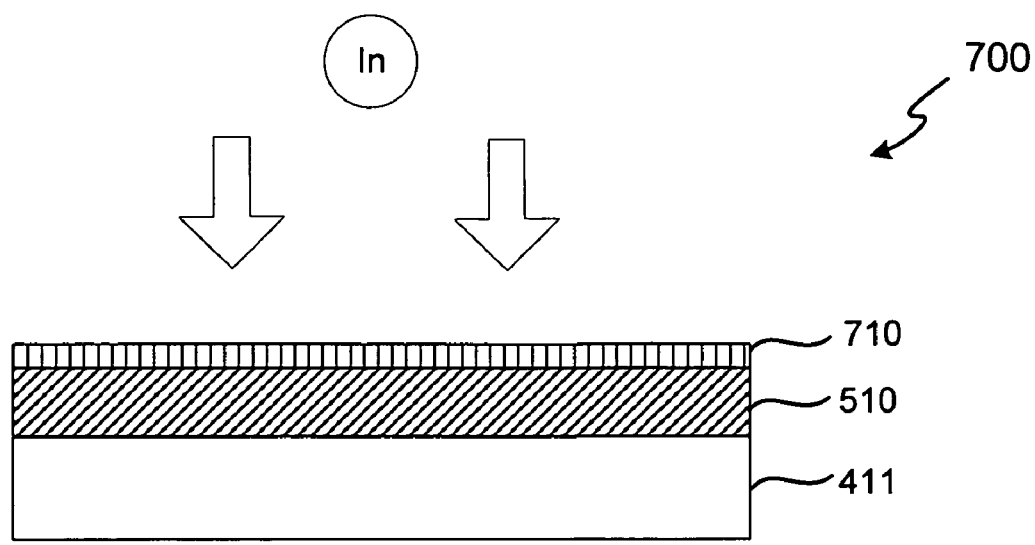
FIG. 7 schematically shows a monolayer of the group III element, indium, being deposited, according to an embodiment of the invention.

In one method embodying the invention, a monolayer of the group III element, indium (In), is deposited on AlGaSb at the heterojunction in step 330. To create an InSb-like bonding at the AlGaSb to InAs heterojunction, a flux of the group III element, indium (In), is introduced in the deposition chamber 413. The indium reacts with antimony 610 to form an InSb layer 710 on the surface of the multilayer 600, as shown in FIG. 7.

Figure 8:
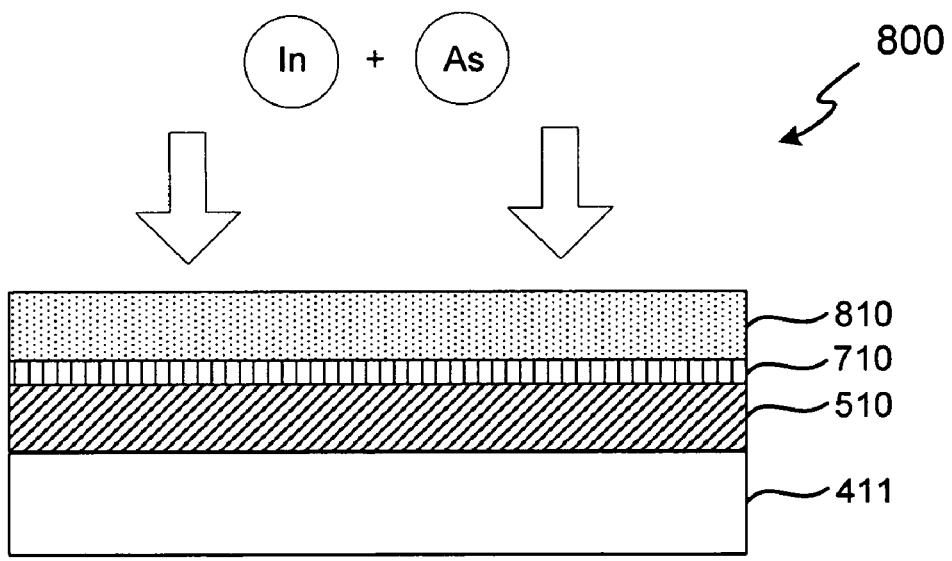
FIG. 8 schematically shows in cross-section a layer of indium arsenide (InAs) being deposited according to an embodiment of the invention.

After the deposition of a monolayer of indium (In), a group V element, arsenic (As) flux, is initiated to grow an InAs layer 810 at step 335. FIG. 8 is an exemplary diagram showing an InAs layer 810 growing on the surface of the InSb layer 710. The deposited layers are collectively referred to as multilayer 800.

Figure 9:
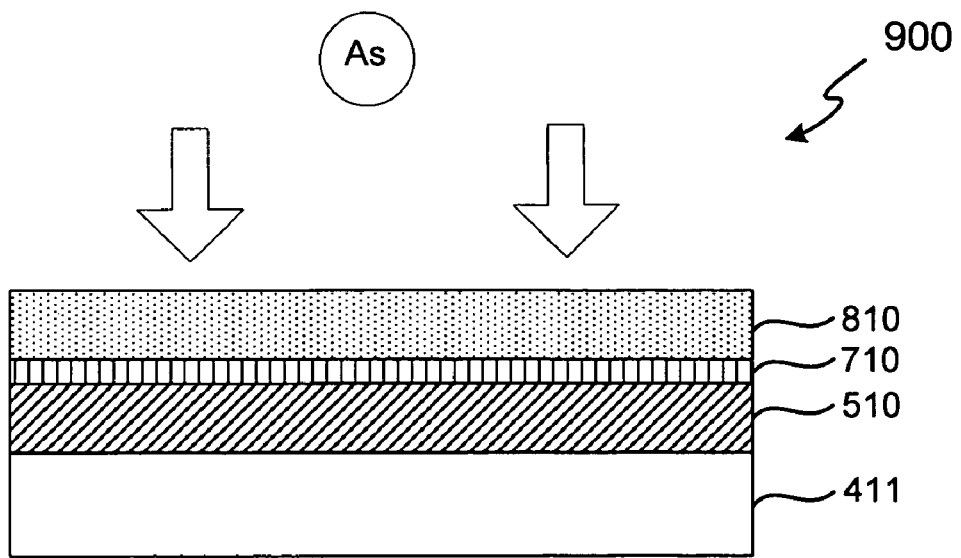
FIG. 9 schematically shows in cross-section a layer of arsenic deposited at the heterojunction, according to an embodiment of the invention.

At step 340, the growth of the InAs layer 810 is terminated and the surface is soaked with group V element, arsenic (As), as shown in FIG. 9. This covers any exposed indium (In) with arsenic (As).

Figure 10:
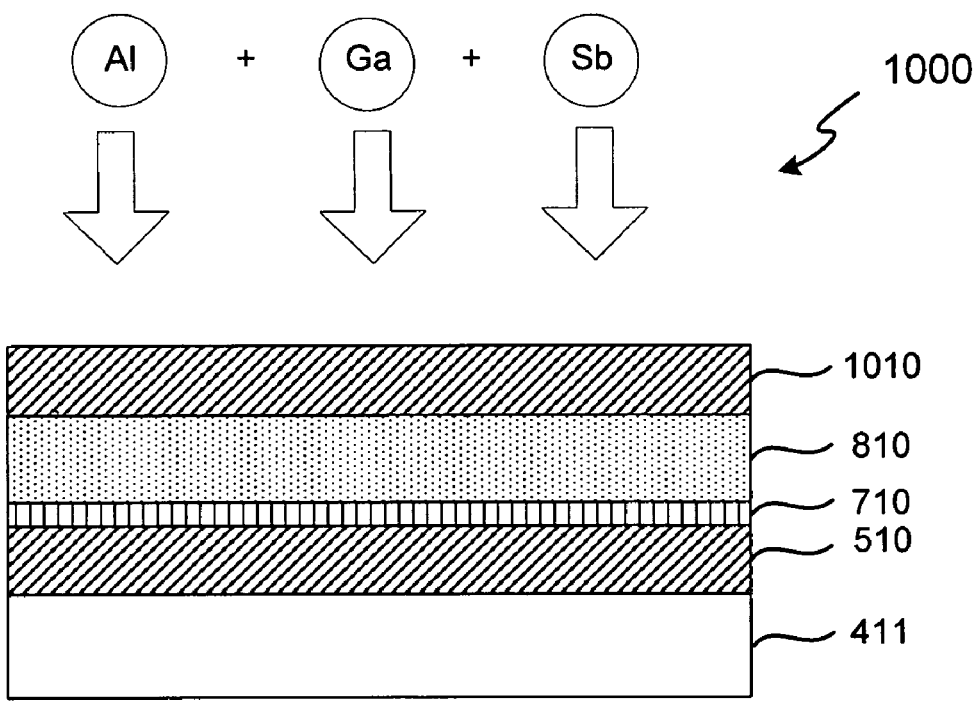
FIG. 10 schematically shows in cross-section the deposition of AlGaSb, according to an embodiment of the invention.

Next, in step 345, the arsenic flux is stopped and fluxes of group III elements, aluminum (Al) and gallium (Ga), and group V element, antimony (Sb) are introduced into the deposition chamber 413. The elements, Al, Ga and Sb, react with one another to form an AlGaSb layer 1010, as shown in FIG. 10. Once the desired thickness of the AlGaSb layer 1010 is achieved, the group III (Al and Ga) and group V (Sb) fluxes are stopped, and growth is terminated in step 350.

Figure 11:
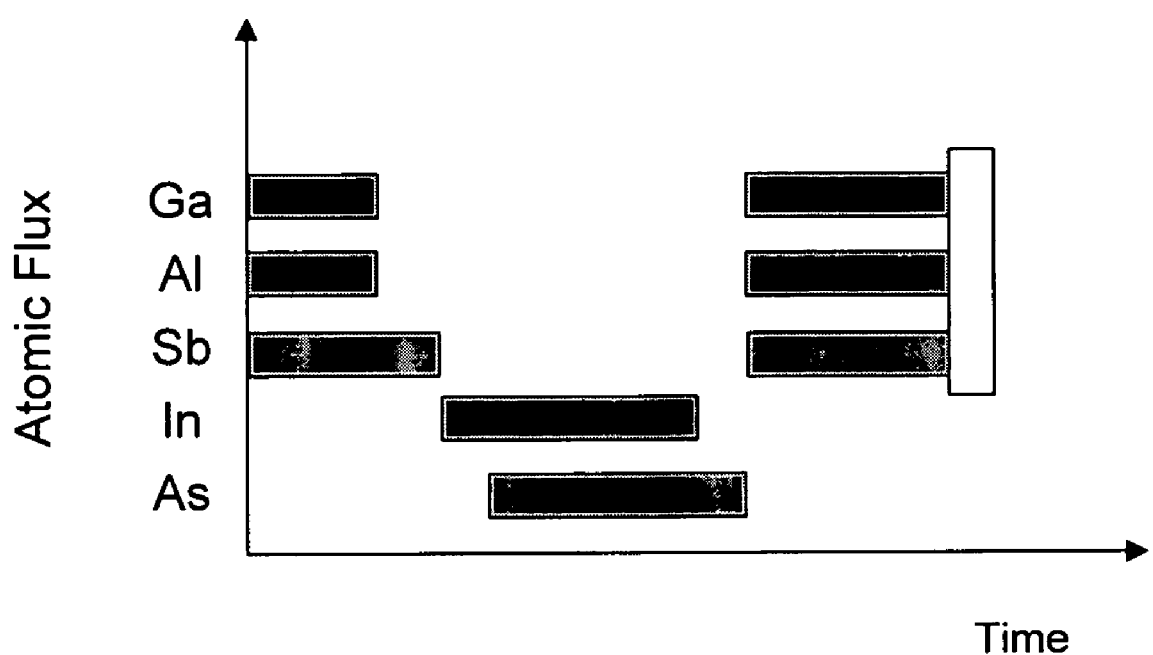
FIG. 11 is an exemplary diagram depicting the time sequence of events for controlling elemental flux in the deposition chamber to produce low defect density heterojunctions, according to an embodiment of the invention.

FIG. 11 is an exemplary diagram depicting the time sequence of events for controlling elemental flux in the deposition chamber 413 to produce low defect density heterojunctions, according to one embodiment of the invention. The diagram shows that aluminum, gallium and antimony fluxes are introduced in the deposition chamber 413, and then the aluminum and gallium fluxes are stopped, while the flux of antimony continues for a predetermined time period. Then a monolayer of indium is deposited, and an InAs layer is grown.

To form a low defect density InAs to AlGaSb heterojunction, the indium flux is stopped, and the arsenic flux continues, to fully bond the surface of the InAs layer 810. Next, the arsenic flux is stopped, and aluminum, gallium and antimony fluxes are introduced in the chamber 413 to react and deposit AlGaSb. Finally, the aluminum, gallium and antimony fluxes are stopped.

Figure 12:
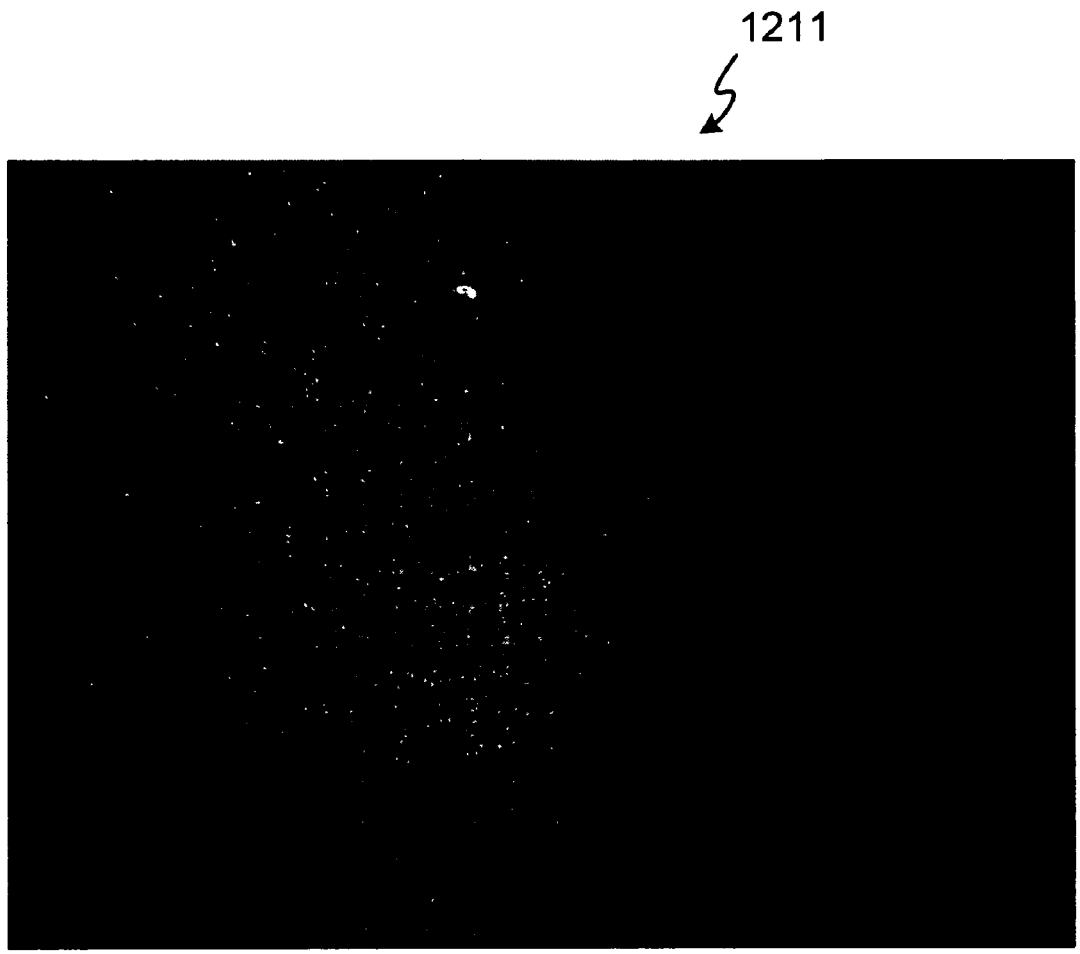
FIG. 12 is a differential interference contrast optical micrograph of the surface of an HFET layer structure illustrating a layer structure with low defect density, according to the method embodying the invention.

FIG. 12 is a differential interference contrast optical micrograph of the surface of an HFET layer structure illustrating a layer structure with low defect density, according to the method embodying the invention. The optical micrograph 1211 shows no nucleated defects 113. Thus, the InAs to AlGaSb heterojunction, fabricated according to the method embodying the invention, reduces the nucleated defects 113 that formed from prior art techniques. With a low defect 113 density, the InAs to AlSb heterojunction minimizes leakage currents from gates.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. For example, other compounds can be used at the unforced heterojunction from those described above to achieve a low defect density at the interface. Those skilled in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method for forming a low defect density heterojunction between a first and a second compound, the first and second compounds each includes a group III element combined with a group V element in the periodic table, the method comprising:
   introducing in a molecular beam epitaxy deposition chamber a flux of the group III and V elements for the first compound to form a first single layer consisting of the group III and V elements for the first compound, the first single layer having a first top surface comprising the group III and V elements for the first compound;
   stopping the flux of the group III element for the first compound after a first predetermined time period while continuing the flux of the group V element for the first compound to form a group V layer on the first top surface comprising the group III and V elements for the first compound;
   stopping the flux of the group V element for the first compound after a second predetermined time period, to form a second top surface comprising the group V element for the first compound;
   introducing simultaneously in the molecular beam epitaxy deposition chamber a flux of the group III element and the group V element for the second compound to form a second single layer consisting of the group III and V elements for the second compound on the second top surface comprising the group V element for the first compound; and
   stopping the flux of the group III and V elements for the second compound after a third predetermined time period.

2. The method of claim 1, wherein the group III element for the first compound is indium (In).

3. The method of claim 1, wherein the group V element for the second compound is antimony (Sb).

4. The method of claim 1, wherein the group V element for the first compound is arsenic (As).

5. The method of claim 1, wherein the group III element for the second compound is aluminum (Al) or gallium (Ga).

6. The method of claim 1, wherein the heterojunction between the first and second compounds is unforced.

7. A method for forming a low defect density heterojunction between a first and a second semiconductor compound, the first semiconductor compound includes a first and a second element, the second semiconductor compound includes a third and a fourth element, the first and third elements are selected from a group consisting essentially of group I, group II, group III, and group IV elements of the periodic table, and the second and fourth elements are selected from a group consisting essentially of group V, group VI, and group VII elements of the periodic table, the method comprising the steps of:
   introducing in a molecular beam epitaxy deposition chamber a flux of the first and second elements for the first semiconductor compound during at least one overlapping time to form a first semiconductor compound layer, the first semiconductor compound layer having a first top surface comprising the first and second elements for the first semiconductor compound;
   stopping the flux of the first element for the first semiconductor compound after a first predetermined time period while continuing the flux of the second element for the first semiconductor compound to form a second element layer on the first top surface comprising the first and second elements for the first semiconductor compound;
   stopping the flux of the second element for the first semiconductor compound after a second predetermined time to form a second top surface comprising the second element for the first semiconductor compound;
   introducing simultaneously in the molecular beam epitaxy deposition chamber a flux of the third and fourth elements for the second semiconductor compound to form a second semiconductor compound layer on the second top surface comprising the second element for the first semiconductor compound; and
   stopping the flux of the third and fourth elements for the second semiconductor compound after a third predetermined time period has lapsed.

8. The method of claim 7, wherein the first element for the first semiconductor compound is indium (In).

9. The method of claim 7, wherein the second element for the first semiconductor compound is arsenic (As).

10. The method of claim 7, wherein the fourth element for the second semiconductor compound is antimony (Sb).

11. The method of claim 7, wherein the third element for the second semiconductor compound is aluminum (Al).

12. The method of claim 7, wherein the third element for the second semiconductor compound is gallium (Ga).

13. A method for forming a low defect density heterojunction between a first and a second compound, the first and second compounds each includes a group III element combined with a group V element in the periodic table, the method comprising:

(a) introducing in a molecular beam epitaxy deposition chamber a flux of the group III and V elements for the first compound to form a first single compound layer consisting of the group III and V elements for the first compound, the first single compound layer having a first top surface comprising the group III and V elements for the first compound;

(b) stopping the flux of the group III element for the first compound after a first predetermined time period while continuing the flux of the group V element for the first compound to form a group V layer on the first top surface comprising the group III and V elements for the first compound;

(c) stopping the flux of the group V element for the first compound after a second predetermined time period, to form a second top surface comprising the group V element for the first compound;

(d) introducing simultaneously in the molecular beam epitaxy deposition chamber a flux of the group III element and the group V element for the second compound to form a second single layer consisting of the group III and V elements for the second compound on the second top surface comprising the group V element for the first compound; and (e) stopping the flux of the group III and V elements for the second compound after a third predetermined time period.

14. The method of claim 13, wherein the group III element for the first compound is indium (In).

15. The method of claim 13, wherein the group V element for the second compound is antimony (Sb).

16. The method of claim 13, wherein the group V element for the first compound is arsenic (As).

17. The method of claim 13, wherein the group III element for the second compound is aluminum (Al) or gallium (Ga).

18. The method of claim 13, wherein the heterojunction between the first and second compounds is unforced.

* * * * *